(12) United States Patent
Neumann

(10) Patent No.: US 9,530,935 B2
(45) Date of Patent: Dec. 27, 2016

(54) METHOD FOR FABRICATING A PLURALITY OF OPTO-ELECTRONIC SEMICONDUCTOR CHIPS, AND OPTO-ELECTRONIC SEMICONDUCTOR CHIP

(71) Applicant: OSRAM Opto Semiconductors GmbH, Regensburg (DE)

(72) Inventor: Wolfgang Neumann, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/418,916

(22) PCT Filed: Jul. 18, 2013

(86) PCT No.: PCT/EP2013/065187
§ 371 (c)(1),
(2) Date: Jan. 30, 2015

(87) PCT Pub. No.: WO2014/019865
PCT Pub. Date: Feb. 6, 2014

(65) Prior Publication Data
US 2015/0270446 A1    Sep. 24, 2015

(30) Foreign Application Priority Data

Jul. 30, 2012  (DE) .................... 10 2012 106 953

(51) Int. Cl.
*H01L 33/60* (2010.01)
*H01L 33/38* (2010.01)
(Continued)

(52) U.S. Cl.
CPC ......... *H01L 33/382* (2013.01); *H01L 33/0079* (2013.01); *H01L 33/20* (2013.01);
(Continued)

(58) Field of Classification Search
None
See application file for complete search history.

(56) References Cited

U.S. PATENT DOCUMENTS 5,266,525 A * 11/1993 Morozumi ..................... 438/624
6,242,327 B1 * 6/2001 Yokoyama ........ H01L 29/66863
117/104
(Continued)

FOREIGN PATENT DOCUMENTS

DE    102007022947 A1    10/2008
DE    102008011848 A1     9/2009
(Continued)

OTHER PUBLICATIONS

"Lumileds introduces thin film flip chips to boost LED brightness," LEDs Magazine, http://www.ledsmagazine.com/news/4/7/16, Jul. 11, 2007, 1 page.
(Continued)

*Primary Examiner* — Duy T Nguyen
*Assistant Examiner* — Bo Bin Jang
(74) *Attorney, Agent, or Firm* — Slater Matsil, LLP

(57) ABSTRACT

A method for fabricating optoelectronic semiconductor chips and optoelectronic semiconductor chips are disclosed. In embodiments the method comprises depositing a semiconductor layer sequence having an active, the active region being arranged between a first semiconductor layer and a second semiconductor layer on a growth substrate, attaching the semiconductor layer sequence to a carrier and forming a plurality of recesses extending through the carrier, the second semiconductor layer and the active region into the first semiconductor layer. The method further comprises forming first contacts on a first main surface of the carrier, the first main surface facing away from the semiconductor layer sequence, wherein the first contacts are electrically conductively connected to the first semiconductor layer in the region of the recesses and singulating the carrier and the semiconductor layer sequence into the plurality of optoelectronic semiconductor chips, wherein each semiconductor chip has at least one recess.

20 Claims, 5 Drawing Sheets

(51) Int. Cl.
*H01L 33/00* (2010.01)
*H01L 33/20* (2010.01)
*H01L 33/40* (2010.01)

(52) U.S. Cl.
CPC ............ *H01L 33/60* (2013.01); *H01L 33/405* (2013.01); *H01L 2924/0002* (2013.01); *H01L 2933/0016* (2013.01); *H01L 2933/0025* (2013.01); *H01L 2933/0033* (2013.01)

(56) References Cited

U.S. PATENT DOCUMENTS

| | | | |
|---|---|---|---|
| 6,268,619 B1 * | 7/2001 | Kosaki et al. | 257/276 |
| 7,365,005 B1 * | 4/2008 | Gadgil | 438/637 |
| 8,482,026 B2 | 7/2013 | Höppel | |
| 8,653,540 B2 | 2/2014 | Engl et al. | |
| 8,823,024 B2 | 9/2014 | Engl et al. | |
| 2004/0130002 A1 | 7/2004 | Weeks et al. | |
| 2011/0079805 A1 | 4/2011 | Yu et al. | |
| 2011/0198609 A1 | 8/2011 | Huang | |
| 2012/0007101 A1 * | 1/2012 | Yang et al. | 257/76 |
| 2012/0007120 A1 | 1/2012 | Kim et al. | |

FOREIGN PATENT DOCUMENTS

| | | |
|---|---|---|
| DE | 102009032486 A1 | 1/2011 |
| WO | 2011033516 A1 | 3/2011 |

OTHER PUBLICATIONS

"Thin Wafer Manufacturing Equipment & Materials Markets," Yole Development, Technology & Market Report, Jun. 2011, 2 pages.

* cited by examiner

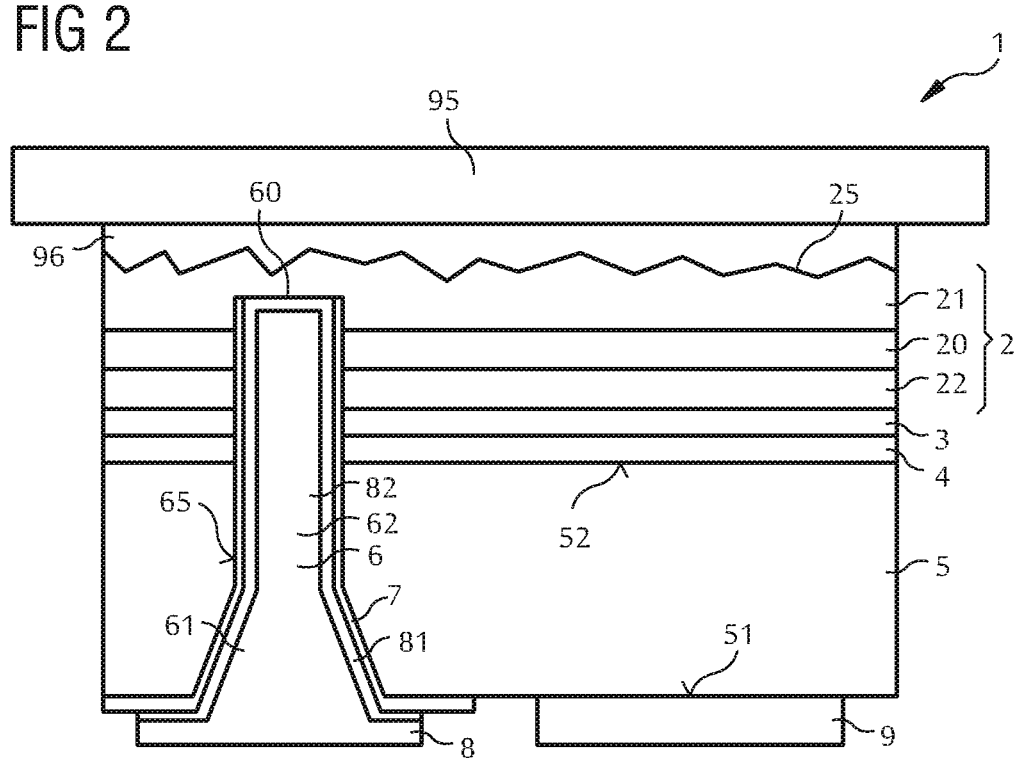

METHOD FOR FABRICATING A PLURALITY OF OPTO-ELECTRONIC SEMICONDUCTOR CHIPS, AND OPTO-ELECTRONIC SEMICONDUCTOR CHIP

This patent application is a national phase filing under section 371 of PCT/EP2013/065187, filed Jul. 18, 2013, which claims the priority of German patent application 10 2012 106 953.0, filed Jul. 30, 2012, each of which is incorporated herein by reference in its entirety.

TECHNICAL FIELD

The present application relates to a method for fabricating optoelectronic semiconductor chips, and to an optoelectronic semiconductor chip.

BACKGROUND

Light-emitting diode semiconductor chips often have an electrical connection for the purpose of making electrical contact on the front side, the electrical contact being made with said electrical connection via a wire bonding connection. However, such a wire bonding connection makes it more difficult to obtain compact embodiments of the LED housing and, moreover, constitutes an additional risk of failure.

SUMMARY OF THE INVENTION

Embodiments of the invention provide a method for fabricating an optoelectronic semiconductor chip by which semiconductor chips distinguished by good optoelectronic properties can be fabricated in a simple and cost-effective manner. Furthermore, embodiments of the intention specify an optoelectronic semiconductor chip which is distinguished by a high efficiency and at the same time allows a compact configuration of the housing.

In a method for fabricating a plurality of optoelectronic semiconductor chips, in accordance with an embodiment, a semiconductor layer sequence having an active region provided for generating and/or receiving radiation, said active region being arranged between a first semiconductor layer and a second semiconductor layer, is deposited on a growth substrate. The semiconductor layer sequence is fixed to a carrier. The fixing is effected, for example, by a connecting layer, for instance a solder layer or an adhesive layer. Preferably, the semiconductor layer sequence is fixed on that side of the semiconductor layer sequence which faces away from the growth substrate.

A plurality of recesses are formed, said recesses extending through the carrier, the second semiconductor layer and the active region into the first semiconductor layer. First contacts are formed on a first main surface of the carrier, said first main surface facing away from the semiconductor layer sequence, wherein the first contacts are in each case electrically conductively connected to the first semiconductor layer in the region of the recesses. The carrier with the semiconductor layer sequence is singulated into the plurality of optoelectronic semiconductor chips, wherein each semiconductor chip has at least one recess. Each semiconductor chip can also have two or more recesses.

By means of the at least one recess, electrical contact can be made with the first semiconductor layer, which is arranged on that side of the active region which faces away from the carrier, from the first main surface of the carrier. An electrical contact on a radiation exit surface of the semiconductor layer sequence, said radiation exit surface facing away from the carrier, for making electrical contact externally can be dispensed with. Preferably, the recesses are formed after the semiconductor layer sequence has already been fixed to the carrier. At the point in time when the semiconductor layer sequence is fixed to the carrier, therefore, said semiconductor layer sequence does not yet have any recesses which extend from the carrier through the active region into the first semiconductor layer and are provided for making electrical contact with the first semiconductor layer. However, it is conceivable for the semiconductor layer sequence, before being fixed to the carrier, already to have trenches which subdivide the semiconductor layer sequence into individual semiconductor bodies in a lateral direction.

In a preferred configuration, the recesses are formed by an anisotropic etching process. Deep reactive ion etching (DRIE) is suitable, in particular. Deep reactive ion etching is also referred to as the "Bosch process."

With an anisotropic etching process, in particular by deep reactive ion etching, recesses having a large aspect ratio may be obtained, that is to say a large ratio of the depth of the recesses, in a direction running perpendicular to a main extension plane of the semiconductor layers of the semiconductor layer sequence, to the cross section of the recesses in a lateral direction. The aspect ratio is preferably at least 5:1, particularly preferably at least 10:1. The aspect ratio can also be significantly greater, for example, at least 20:1, or at least 30:1. In particular, the aspect ratio can be up to 50:1. The side surfaces of the recesses preferably run perpendicular to the main extension plane.

The recesses can be formed in a continuous process step by an anisotropic etching process, in particular by deep reactive ion etching.

Alternatively, the recesses can be formed by an isotropic etching process in a first substep and by an anisotropic etching process in a second substep. In contrast to an anisotropic etching process, an isotropic etching process leads to the formation of oblique side surfaces of the recesses. In other words, the side surfaces at least in regions do not run perpendicular to a main extension plane of the semiconductor layers of the semiconductor layer sequence. In the region of the recesses that is formed in the first substep, a cross section of the recesses can be enlarged toward the first main surface of the carrier. A subsequent instance of making electrical contact with the first semiconductor layer through the recesses can thus be simplified. The two-stage formation of the recesses as described is preferably carried out in such a way that only material of the carrier is removed in the first substep. After the first substep, therefore, the recess does not extend completely through the carrier.

Preferably, the recesses are formed in such a way that the cross section of the recesses at the level of a second main surface of the carrier, said second main surface facing the semiconductor layer sequence, is identical or substantially identical to the cross section of the recesses at the level of the active region. A substantially identical cross section is understood to mean that the cross-sectional areas differ from one another by at most 10%. In particular, a boundary of the recess at the level of the active region in plan view runs congruently with or within a boundary of the recess at the level of the second main surface of the carrier.

In a further preferred configuration, the carrier is thinned. This is preferably carried out after the semiconductor layer sequence has been fixed to the carrier and furthermore preferably before the recesses are formed. The required etching depth can be reduced as a result. The thinning is preferably carried out mechanically, for example, by grinding. Alternatively, however, a chemical method can also be employed.

In a preferred configuration, an insulation layer is applied before the first contacts are formed, said insulation layer in particular completely covering the side surfaces of the recesses. By means of the insulation layer, material provided for forming the first contact can be electrically insulated from the active region, the second semiconductor layer and from the carrier. In particular, the insulation layer can be formed in a single deposition process such that it directly adjoins the active region and the first main surface of the carrier. The insulation layer is arranged on the first main surface preferably between the first main surface and the first contact, such that the first contact does not adjoin the carrier.

In a further configuration, a first contact layer is applied for the purpose of forming the first contact, said first contact layer directly adjoining the first semiconductor layer and extending from the first semiconductor layer without interruption as far as the first main surface of the carrier.

In this context, without interruption means that the first contact layer forms a continuous current path from the first semiconductor layer toward the first main surface of the carrier, such that electrical contact can be made with the first semiconductor layer externally from the first main surface of the carrier.

For example, a PVD (physical vapor deposition) method, for example, sputtering, or a CVD (chemical vapor deposition) method is suitable for forming the first contact layer. The first contact layer can also be applied by an ALD (atomic layer deposition) method. Such an ALD method can also be carried out multiply in order to obtain a continuously conductive path from the first semiconductor layer to the first main surface of the carrier. The use of material, in particular in comparison with a sputtering method, can be reduced by an ALD method.

The recesses need not be completely filled with contact material. Rather, the recesses can in each case have one or a plurality of cavities.

Alternatively, the recesses can be filled, in particular after the first contact layer has been formed. The filling is preferably effected by an electroplating method. However, some other method, for example, a PVD method or a CVD method, can also be employed.

In a preferred configuration, the growth substrate is removed. The growth substrate can be removed mechanically or chemically, for example. Alternatively, a laser lift-off (LLO) method can also be employed, for example, in the case of a sapphire growth substrate.

A semiconductor chip wherein the growth substrate is removed is also referred to as a thin-film semiconductor chip. The carrier serves for mechanically stabilizing the semiconductor layer sequence, such that the growth substrate is no longer required for this purpose. The growth substrate is preferably removed after the semiconductor layer sequence has already been fixed to the carrier. The fixing of the semiconductor layer sequence to the carrier can be effected in a wafer bonding method, for example.

Preferably, a mirror layer is applied to the semiconductor layer sequence before the semiconductor layer sequence is fixed to the carrier. The recesses extend through the mirror layer. During the operation of the semiconductor chips, radiation generated in the active region or radiation to be detected by the active region can be reflected at the mirror layer. The risk of absorption of radiation by the carrier is reduced as a result. The carrier can therefore also be radiation-nontransmissive to radiation generated in the active region or radiation to be detected by the active region. The mirror layer preferably contains a metal or a metallic alloy comprising at least one of the metals mentioned. In particular, silver or a silver-containing alloy is suitable for the visible spectral range. Furthermore, for the visible, in particular red, to infrared spectral range, the mirror layer can contain zinc, for example, for instance in the form of a zinc-containing alloy.

In accordance with an embodiment, an optoelectronic semiconductor chip comprises a semiconductor body and a carrier, to which the semiconductor body is fixed. A semiconductor layer sequence having an active region provided for generating and/or receiving radiation, said active region being arranged between a first semiconductor layer and a second semiconductor layer, forms the semiconductor body. The semiconductor chip has a recess extending from a first main surface of the carrier, said first main surface facing away from the semiconductor body, through the carrier, the second semiconductor layer and the active region into the first semiconductor layer. A first contact is arranged on the first main surface of the carrier, said first contact being electrically conductively connected to the first semiconductor layer in the region of the at least one recess.

Preferably, the semiconductor chip has a second contact on the first main surface, said second contact being electrically conductively connected to the second semiconductor layer via the carrier. Via the first contact and the second contact, electrical contact can be made with the active region externally, such that charge carriers can be injected into the active region from opposite directions or can be transported away from the active region in opposite directions.

The carrier preferably contains a semiconductor material, in particular silicon. Silicon is available with a large area and in a cost-effective manner and, moreover, is distinguished by good microstructurability. For an electrically conductive connection of the second contact to the second semiconductor layer, the carrier is expediently doped.

The semiconductor body can also have more than one active region. In this case, the at least one recess preferably extends through all of the active regions. In this case, therefore, the first semiconductor layer is that layer which is arranged on the side—facing away from the carrier—of the active region the furthest away from the carrier.

In a configuration, the recess has a partial region in which a cross section of the recess is enlarged toward the first main surface of the carrier. The recess can therefore be formed in a funnel-shaped fashion. This simplifies the production of an electrically conductive connection between the first contact and the first semiconductor layer.

Alternatively, however, the recess can also continuously have the same cross section or substantially the same cross section.

In a preferred configuration, a mirror layer is arranged between the carrier and the semiconductor body. This reduces the risk of absorption of radiation in the carrier.

In particular, the fabrication method described above is suitable for the fabrication of the semiconductor chip described. Features described in connection with the methods can therefore also be used for the semiconductor chip, and vice versa.

BRIEF DESCRIPTION OF THE DRAWINGS

Further features, configurations and expediencies will become apparent from the following description of the exemplary embodiments in conjunction with the figures, in which:

FIG. 2 shows a second exemplary embodiment of an optoelectronic semiconductor chip.

Elements that are identical, of identical type or active identically are provided with the same reference signs in the figures.

The figures and the size relationships of the elements illustrated in the figures among one another should not be regarded as to scale. Rather, individual elements, in particular layer thicknesses, may be illustrated with an exaggerated size in order to enable better illustration and/or in order to afford a better understanding.

DETAILED DESCRIPTION OF ILLUSTRATIVE EMBODIMENTS

Figure 1A:
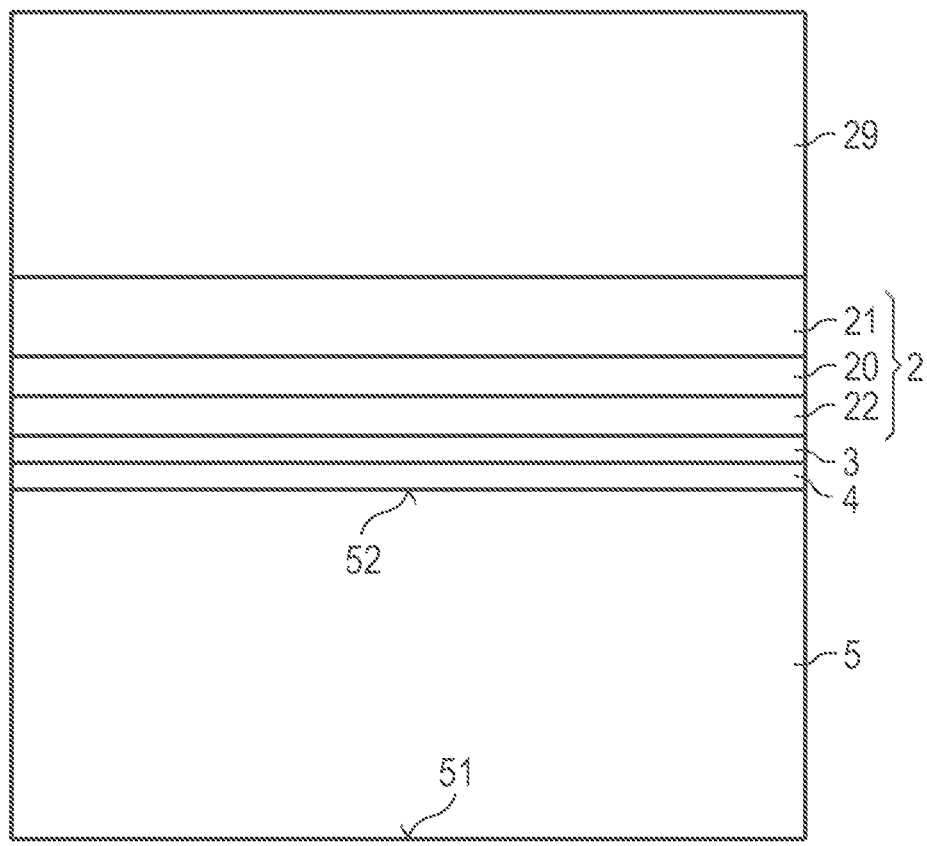
FIGS. 1A to 1H show an exemplary embodiment of a method for fabricating optoelectronic semiconductor chips in schematic section view (FIGS. 1A to 1G) and in a rear view of the completed semiconductor chip illustrated in FIG. 1G in accordance with a first exemplary embodiment.

A first exemplary embodiment of a method for fabricating optoelectronic semiconductor chips is illustrated schematically with reference to FIGS. 1A to 1H. As shown in FIG. 1A, a semiconductor layer sequence is deposited preferably epitaxially, for example, by MOCVD, on a growth substrate 29. The semiconductor layer sequence has a first semiconductor layer 21 facing the growth substrate, an active region 20 and a second semiconductor layer 22 on a side of the active region that faces the first semiconductor layer 21. The first semiconductor layer and the second semiconductor layer differ from one another with regard to their conduction type. By way of example, the first semiconductor layer can be embodied as n-conducting and the second semiconductor layer as p-conducting, or vice versa. The first semiconductor layer and the second semiconductor layer can each comprise a plurality of partial layers.

For the sake of simplified illustration, the figures merely show an excerpt from a wafer assemblage from which a semiconductor chip emerges during fabrication. Furthermore, the fabrication of a luminescence diode, for instance of a light-emitting diode, is described merely by way of example. However, the method is also suitable for the fabrication of a laser diode or of a radiation detector having an active region provided for receiving radiation.

The semiconductor layer sequence 2, in particular the active region 20, preferably contains a III-V compound semiconductor material.

III-V compound semiconductor materials are particularly suitable for generating radiation in the ultraviolet ($Al_xIn_yGa_{1-x-y}N$) through the visible ($Al_xIn_yGa_{1-x-y}N$, in particular for blue to green radiation, or $Al_xIn_yGa_{1-x-y}P$, in particular for yellow to red radiation) into the infrared ($Al_xIn_yGa_{1-x-y}As$) spectral range. It holds true here in each case that $0 \leq x \leq 1$, $0 \leq y \leq 1$ and $x+y \leq 1$, in particular where $x \neq 1$, $y \neq 1$, $x \neq 0$ and/or $y \neq 0$. With III-V compound semiconductor materials, in particular from the material systems mentioned, high internal quantum efficiencies can furthermore be obtained during the generation of radiation.

The active region 20 preferably comprises a pn junction, a double heterostructure, a single quantum well (SQW) or, particularly preferably, a multi quantum well (MQW) structure for generating radiation. In this case, the designation quantum well structure does not exhibit any significance with regard to the dimensionality of the quantization. It therefore encompasses, inter alia, quantum wells, quantum wires and quantum dots and any combination of these structures.

For example, sapphire, silicon carbide or silicon is suitable for the epitaxial deposition, for example, by MOCVD, MBE or LPE, of a semiconductor layer sequence on the basis of $Al_xIn_yGa_{1-x-y}N$ (nitride compound semiconductor material).

A mirror layer 3 is applied to the semiconductor layer sequence 2, for example, by vapor deposition or sputtering. The mirror layer preferably contains a metal or a metallic alloy. By way of example, silver or a silver-containing alloy is distinguished by a particularly high reflectivity in the visible spectral range. Alternatively, however, the mirror layer can also contain nickel, chromium, palladium, rhodium, aluminum, zinc or gold or comprise a metallic alloy comprising at least one of the metals mentioned. For example, a gold-zinc alloy is suitable for the red to infrared spectral range.

The growth substrate 29 with the semiconductor layer sequence 2 is fixed to a carrier 5 in a wafer bonding process by a connecting layer 4, for example, a solder layer or an electrically conductive adhesive layer. The carrier 5 has a first main surface 51 facing away from the semiconductor layer sequence and a second main surface 52 facing the semiconductor layer sequence 2.

Even further layers, for example, a diffusion barrier or an encapsulation of the mirror layer, can be arranged between the semiconductor layer sequence 2 and the carrier 5.

Silicon, in particular, is suitable for the carrier 5 on account of the good microstructurability. However, some other material, in particular some other semiconductor material, such as germanium or gallium arsenide, for example, can also be employed. Preferably, the carrier is doped and has the same conduction type as the second semiconductor layer 22. Making electrical contact with the second semiconductor layer via the carrier is thus simplified.

Figure 1B:
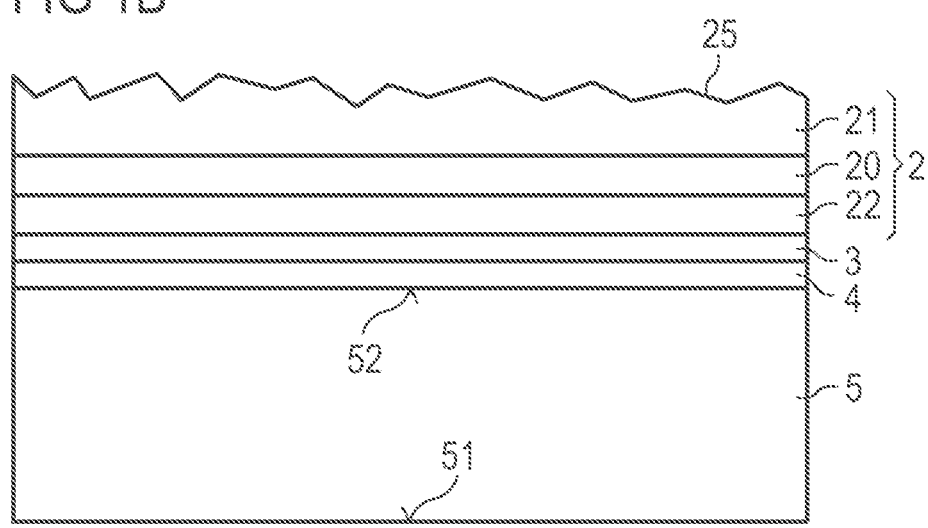

As illustrated in FIG. 1B, after the carrier has been fixed, the carrier can be thinned from the first main surface 51 in order to reduce the thickness of the carrier 5. The thinning can be effected by a mechanical process, for example, grinding, polishing or lapping, and/or by a chemical process. The structural height of the finished semiconductor chips is reduced by the thinning process. Moreover, the thinning process simplifies the later process of singulation to semiconductor chips, for example, by laser separation.

Even before thinning the carrier 5 can have a thickness of at most 50 μm. The outlay during thinning can thus be reduced. In a departure therefrom, however, the thickness can also be greater than 50 μm, for example, between 50 μm and 300 μm inclusive.

In order to reduce the risk of breaking, the semiconductor layer sequence, on the opposite side relative to the carrier, can be fixed to a temporary carrier (not explicitly illustrated), in particular before the thinning process.

The growth substrate 29 is removed. For a silicon growth substrate, in particular a mechanical method, a chemical method or the combination of a mechanical method with a subsequent chemical method is suitable for this purpose. A radiation-transmissive substrate, for example, silicon carbide or sapphire, can also be removed by an LLO method.

A radiation exit surface of the semiconductor layer sequence 2, said radiation exit surface facing away from the carrier, is provided with a structuring 25. The coupling-out efficiency for the radiation generated in the active region 20 during operation can be increased by the structuring. The structuring can be effected, for example, by a chemical method, in particular a wet-chemical etching process. The structuring can be formed in an irregular or regular fashion, in particular in a periodic fashion, for instance for forming a photonic grating. A photolithography method is not required for forming an irregular structuring.

Figure 1C:
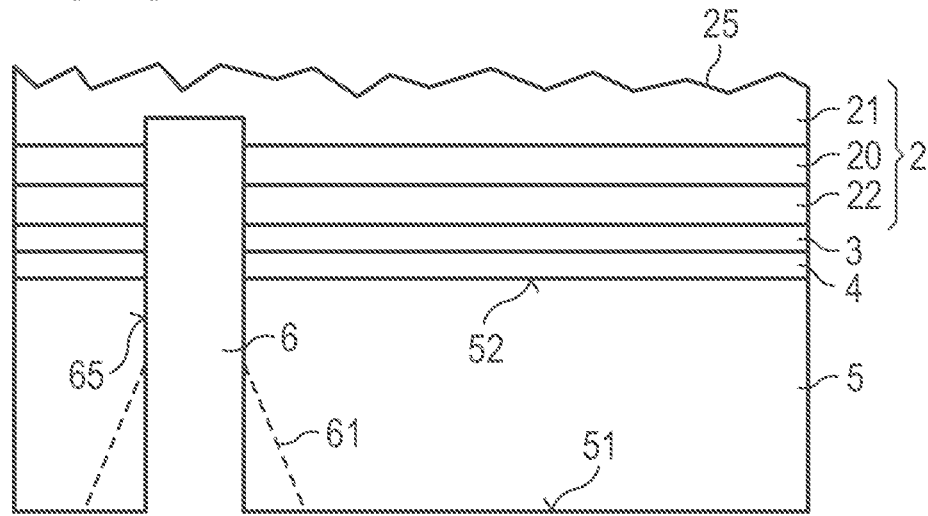

As illustrated in FIG. 1C, recesses 6 are formed from the first main surface 51 of the carrier 5, said recesses extending through the carrier 5 and the active region 20 into the first semiconductor layer 21.

In particular an anisotropic etching method, for example, reactive ion etching, in particular deep reactive ion etching, is suitable for forming recesses having a high to very high aspect ratio. The aspect ratio is preferably at least 5:1, particularly preferably at least 10:1. The aspect ratio can also be even higher, for example, 20:1 or more, in particular up to 50:1. The recesses 6 can be produced continuously by such an anisotropic etching process. In a departure therefrom, the recesses can also be formed in two stages, wherein the recesses are formed by an isotropic etching method, for example, a wet-chemical etching method, in a first substep. The first substep is carried out in such a way that the recess formed thereby does not yet extend completely through the carrier 5. An anisotropic etching method is carried out in the second substep. This gives rise, as illustrated with the aid of the dashed line 61 in FIG. 1C, to partial regions 61 of the recess 6 with side surfaces 65 running obliquely with respect to the main extension plane of the semiconductor layers of the semiconductor layer sequence 2.

Both in the case of the continuous formation of the recess 6 by an anisotropic etching method and in the case of a two-stage formation by an isotropic substep and an anisotropic substep, the recess is preferably formed in such a way that the cross section of the recesses in the region of the second main surface 52 of the carrier and the cross section of the recesses in the region of the active region 20 are identical or at least substantially identical. In particular, a boundary of the recesses at the level of the active region in a plan view of the semiconductor layer sequence lies completely within a boundary of the recesses at the level of the second main surface 32 of the carrier or runs congruently therewith.

Figure 1D:
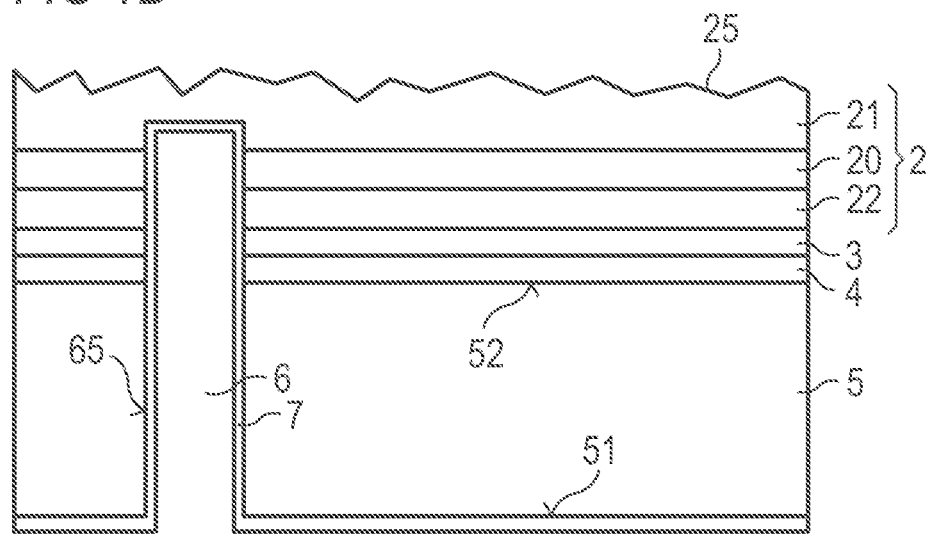

Afterward, as illustrated in FIG. 1D, an insulation layer, for example, a silicon oxide layer, is applied, and covers the side surfaces 65 of the recesses 6 and the first main surface of the carrier 5. The insulation layer can be deposited, for example, by a CVD (Chemical Vapor Deposition) method, for instance by a PECVD (Plasma Enhanced Chemical Vapor Deposition) method.

The insulation layer 7 is therefore a layer which continuously covers the side surfaces 65 and, in the region of the recesses 6, regionally directly adjoins the carrier 5 and regionally directly adjoins the semiconductor layer sequence 2, in particular the active region 20. In other words, the electrical insulation of the contact material subsequently introduced into the recesses 6 from the active region 20 and the second semiconductor layer 22 and also from the carrier 5 is obtained by a continuous layer produced in a single deposition step.

Figure 1E:
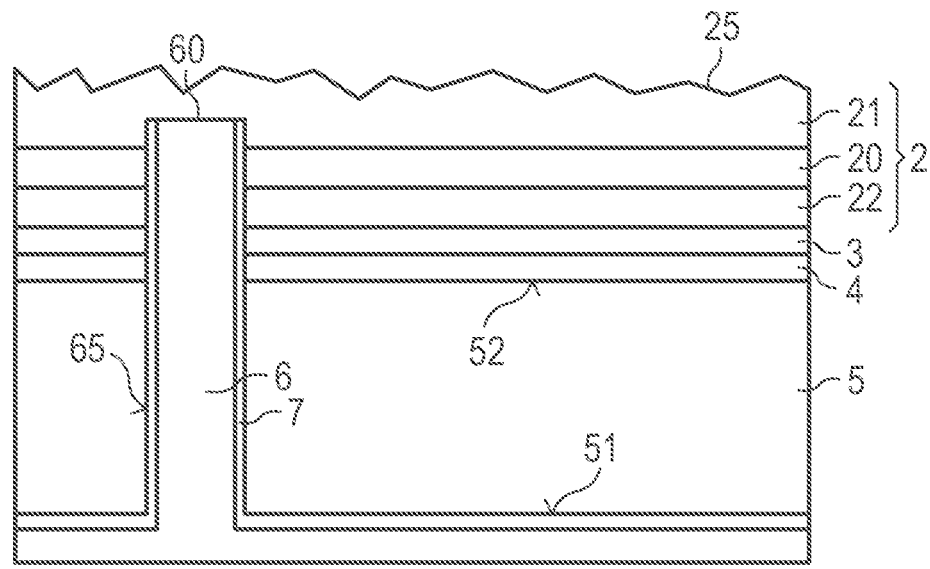
Figure 1F:
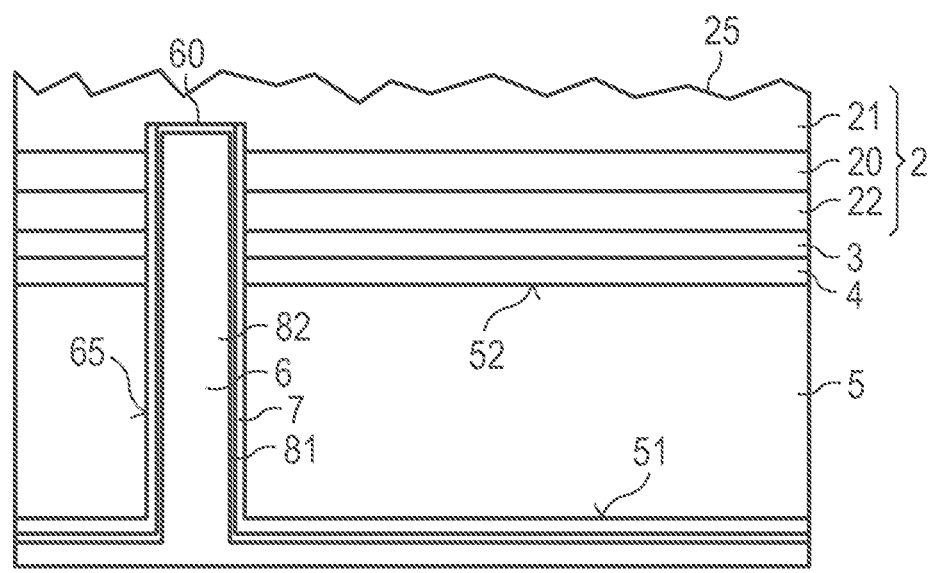

Afterward, as illustrated in FIG. 1E, a connection window 60 is formed in the insulation layer 7, the first semiconductor layer 21 being exposed in said connection window. This is carried out preferably by a further anisotropic etching step, in particular a further DRIE etching step.

A first contact layer 81 is subsequently applied, via which electrical contact can be made with the first semiconductor layer 21 from the rear side, that is to say the first main surface 51 of the carrier.

The first contact layer can be applied by vapor deposition or by a PVD method, for example, sputtering. Alternatively, an ALD method is also suitable, which in particular can also be carried out multiply in succession in order to obtain a continuous covering of the side surfaces of the recesses 6 with a sufficient electrical conductivity. By an ALD method a continuous electrical path from the first semiconductor layer 21 to the first main surface 51 of the carrier may be ensured with reduced material consumption.

Afterward, the recesses 6 can be filled by a second electrically conductive contact layer 82. The second contact layer can, for example, contain aluminum or nickel or consist of such a material. This can be carried out, for example, by an electroplating method, for instance a LIGA (Lithographie, Galvanik and Abformung [lithography, electroplating and molding]) method. It has been found that defect-free filling of the recess despite the high aspect ratio of the recesses may be achieved with such a method.

In a departure from the exemplary embodiment described, the recesses 6 can also remain at least partly unfilled, that is to say that the completed semiconductor chip has one or a plurality of cavities in the region of the recesses.

During the process of forming the first contact layer 81 and, if appropriate, the second contact layer 82, the first main surface 51 of the carrier 5 is also coated. As a result of a separation into two partial regions, there are formed on the first main surface 51 a first contact 8 for making electrical contact with the first semiconductor layer externally and a second contact 9, which is electrically conductively connected to the second semiconductor layer sequence 22 via the carrier 5. The separation can be carried out, for example, by a lithography step and an etching step. The two electrical contacts can therefore be produced in a common deposition step. By applying an electrical voltage between the first contact 8 and the second contact 9, charge carriers may be injected into the active region 20 from opposite directions and recombine there with emission of radiation. An electrical contact on the radiation exit surface of the semiconductor body 2 for making electrical contact with the first semiconductor layer is therefore not required.

For subsequently fixing the singulated semiconductor chips, for example, by soldering, for instance by reflow soldering, a contact elevation (bump) 93, for example, composed of gold or composed of a gold-containing alloy, for instance AuSn, NiAu:Sn or InAuSn, can in each case be applied on the first contact 8 and the second contact 9.

Figure 1G:
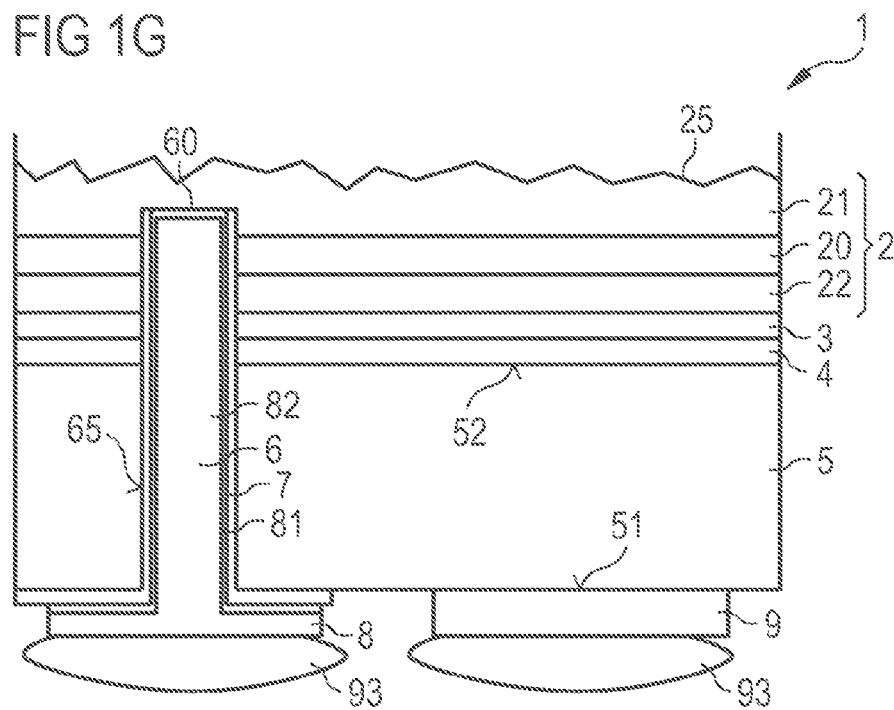

In order to complete the semiconductor chips, the carrier 5 with the semiconductor layer sequence 2 is singulated into semiconductor chips, such that each semiconductor chip, as illustrated in FIG. 1G, has at least one recess 6. The singulation process is preferably carried out by laser separation. However, a mechanical method, for example, sawing, scribing, breaking, stealth dicing or splitting, can also be employed. Prior to singulation, the semiconductor layer sequence may already have been subdivided into individual semiconductor bodies by trenches, the singulation being carried out along the trenches.

In plan view, the recess is arranged completely within the semiconductor body formed by the semiconductor layer sequence. That is to say that the recess is surrounded by material of the semiconductor layer sequence along its entire circumference. In a departure from the exemplary embodiment described, the semiconductor chip can also have two or more recesses.

Figure 1H:
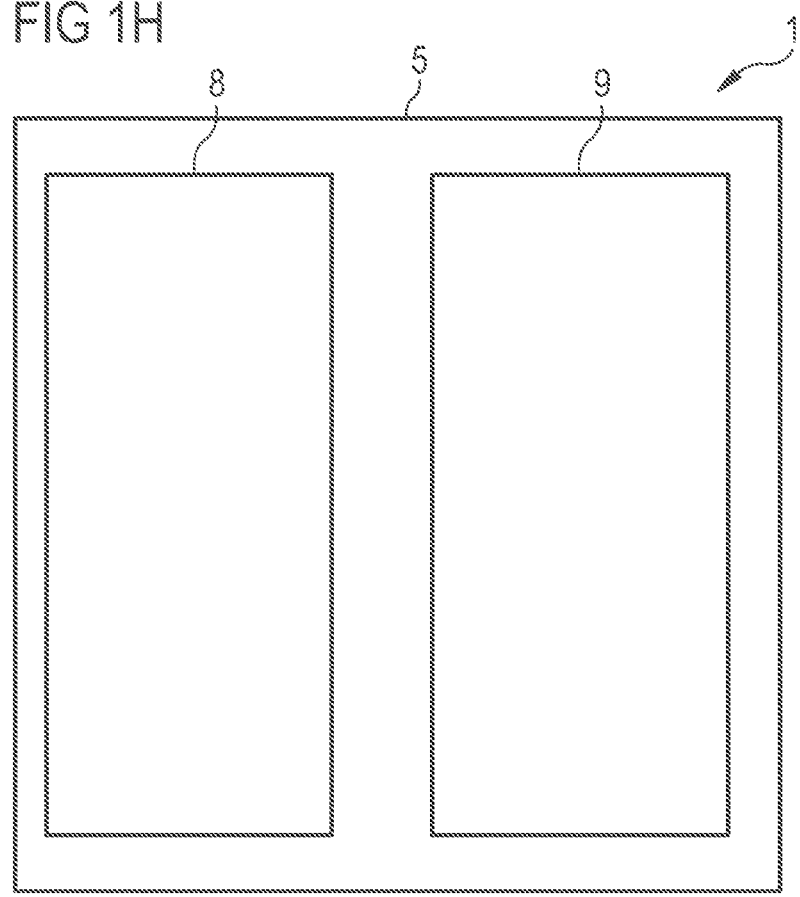

In contrast to a so-called flip-chip, wherein the growth substrate remains in the completed semiconductor chip, a lateral coupling-out of radiation is limited to the side surface of the semiconductor body formed by the semiconductor layer sequence 2. Therefore the semiconductor chip constitutes to a good approximation a pure surface emitter having a Lambertian emission characteristic. Preferably, at least 70% of the radiation generated in the active region 20 emerges through the radiation exit surface of the semiconductor chip 1, said radiation exit surface being situated opposite the carrier. A rear side view of the semiconductor chip 1 illustrated in FIG. 1G in accordance with a first exemplary embodiment is depicted in FIG. 1H. The semiconductor chip has two rear-side contacts 8, 9 arranged alongside one another in a lateral direction. Electrical contact can be made with the semiconductor chip 1 during mounting in a housing or on a connection carrier, for example, a printed circuit board, directly during the production of the fixing in the housing or the connection carrier. A wire bonding connection for producing an electrical top-side contact can therefore be dispensed with, as a result of which the fabrication costs and also the gold requirement can be reduced. Designs having a particularly small extent in the vertical direction, that is to say perpendicular to a main extension plane of the semiconductor layers of the semiconductor body, can be obtained in a simplified manner as a result. Preferably, the extent of the semiconductor chip in the vertical direction is at most 200 µm, for example, between 120 µm and 180 µm inclusive. However, it is also possible to fabricate semiconductor chips whose extent in the vertical direction is reduced to a further degree and is at most 100 µm.

A second exemplary embodiment of a semiconductor chip is illustrated schematically in sectional view in FIG. 2. This second exemplary embodiment substantially corresponds to the first exemplary embodiment described in association with FIG. 1G. In contrast thereto, the recess 6 has a partial region 61 in which the side surfaces 65 of the recesses run obliquely, that is to say not perpendicularly, with respect to the main extension plane of the semiconductor layers of the semiconductor layer sequence 2. In this region, the cross section of the recesses 6 increases toward the first main surface 51 of the carrier 5, in particular in a funnel-shaped manner. Accordingly, the partial region 61 has a wider cross section than the further or second region 62. This partial region 61 can be produced in the manner as described in association with FIG. 1C.

Furthermore, a conversion element 95 is arranged on the radiation exit surface situated opposite the carrier 5. The conversion element is provided for at least partly converting radiation generated in the active region 20 during operation into secondary radiation, such that the overall mixed radiation, in particular mixed light which appears white to the human eye, is emitted. The conversion element 95 can be embodied in the form of a lamina, for example, which is fixed to the semiconductor body 2 by a fixing layer 96. The conversion element 95 can have the same basic form as the carrier 5. A recess for leading through a wire bonding connection, for example, in the form of a milled-out portion, can be dispensed with on account of the rear-side contacts of the semiconductor chip 1. The fabrication of the conversion element is simplified as a result. Furthermore, the conversion element can also project beyond the semiconductor chip in a lateral direction at least regionally or along the entire circumference. The risk of radiation generated in the active region being emitted laterally past the conversion element is reduced as a result. The size of the conversion element is no longer restricted by requirements during the production of the wire bonding connection. In a departure therefrom, however, the conversion element can also terminate flush with the semiconductor body 2.

The conversion element can comprise, for example, a matrix material into which a phosphor is embedded. Alternatively, the conversion element can be embodied as a conversion ceramic. A silicone, for example, is suitable for the fixing layer 96. The fixing layer can likewise be admixed with phosphor.

The conversion element 95 can also be employed in the case of the first exemplary embodiment described in association with FIG. 1G.

This patent application claims the priority of German Patent Application 10 2012 106 953.0, the disclosure content of which is hereby incorporated by reference.

The invention is not restricted by the description on the basis of the exemplary embodiments. Rather, the invention encompasses any novel feature and also any novel combination of features, which in particular includes any combination of features in the patent claims, even if this feature or this combination itself is not explicitly specified in the patent claims or the exemplary embodiments.

The invention claimed is:

1. An optoelectronic semiconductor chip comprising:
a carrier; and
a semiconductor body disposed on the carrier, the semiconductor body comprising a semiconductor layer sequence having an active region configured to generate or receive radiation, the active region being arranged between a first semiconductor layer and a second semiconductor layer,
wherein the semiconductor chip has a recess extending from a first main surface of the carrier, through the carrier, the second semiconductor layer and the active region into the first semiconductor layer, the first main surface facing away from the semiconductor body,
wherein a first contact is arranged on the first main surface of the carrier, the first contact being connected to the first semiconductor layer in the recess, and
wherein the recess comprises a first region that does not completely extend through the carrier, wherein a cross section of the recess increases in the first region toward the first main surface of the carrier, wherein a cross section of the recess towards a second main surface of the carrier is identical or substantially identical to a cross section of the recess at a level of the active region, the second main surface facing the semiconductor body,
wherein the recess comprises a second region arranged on a side of the first region that faces the semiconductor body, wherein the second region partially extends through the carrier, and wherein a cross section of the second region on a side facing toward the first region is identical or substantially identical to the cross section of the recess at the level of the active region.

2. The semiconductor chip according to claim 1, wherein the semiconductor chip has a second contact on the first main surface of the carrier, the second contact being electrically conductively connected to the second semiconductor layer via the carrier.

3. The semiconductor chip according to claim 1, wherein the carrier comprises silicon.

4. The semiconductor chip according to claim 1, wherein a mirror layer is arranged between the carrier and the semiconductor body.

5. The semiconductor chip according to claim 1, wherein a boundary of the recess at the level of the active region in plan view runs congruently with or within a boundary of the recess at the level of the second main surface of the carrier.

6. A method for fabricating a plurality of optoelectronic semiconductor chips, the method comprising:

disposing a semiconductor layer sequence on a carrier, the semiconductor layer sequence having an active region for generating or receiving radiation, the active region being arranged between a first semiconductor layer and a second semiconductor layer on a growth substrate;

forming a plurality of recesses extending through the carrier, the second semiconductor layer and the active region into the first semiconductor layer, wherein forming the recesses comprises:

performing an isotropic etching process in a first substep; and performing an anisotropic etching process in a second substep, wherein the recesses do not completely extend through the carrier after the first substep, and wherein the recesses are finalized after the second substep;

forming first contacts on a first main surface of the carrier, the first main surface facing away from the semiconductor layer sequence, wherein the first contacts are electrically conductively connected to the first semiconductor layer in regions of the recesses; and singulating the carrier with the semiconductor layer sequence into the plurality of optoelectronic semiconductor chips, wherein each semiconductor chip has at least one recess, wherein the recesses in the carrier comprises first and second regions, wherein the first regions do not completely extend through the carrier, wherein cross sections of the recesses increase in the first regions toward the first main surface of the carrier, the first main surface facing away from the semiconductor layer sequence, wherein cross sections of the first regions towards a second main surface of the carrier are identical or substantially identical to the cross sections of the recesses at a level of the active region, the second main surface facing the semiconductor layer sequence, wherein the second regions are arranged on sides of the first regions that face the semiconductor layer sequence, wherein the second regions partially extend through the carrier, and wherein cross sections of the second regions on sides facing toward the first regions are identical or substantially identical to cross sections of the recesses at the level of the active region.

7. The method according to claim 6, wherein anisotropic etching comprises a deep reactive ion etching process.

8. The method according to claim 6, further comprising forming an insulation layer on surfaces of the plurality of recesses before forming the first contacts.

9. The method according to claim 6, wherein forming the first contacts comprises forming a first contact layer extending without interruption from the first semiconductor layer to the first main surface of the carrier.

10. The method according to claim 9, wherein forming the first contact layer comprises applying atomic layer deposition (ALD).

11. The method according to claim 6, forming the first contacts comprises filling the recesses applying an electroplating method.

12. The method according to claim 6, further comprising thinning the carrier after attaching the semiconductor layer sequence to the carrier and before forming the plurality of recesses.

13. The method according to claim 6, further comprising removing the growth substrate.

14. The method according to claim 6, further comprising removing the growth substrate after the semiconductor layer sequence has been fixed to the carrier.

15. The method according to claim 6, wherein, in the first substep, removing only a material of the carrier.

16. A method for fabricating a plurality of optoelectronic semiconductor chips, the method comprising:

disposing a semiconductor layer sequence on a carrier, the semiconductor layer sequence having an active region for generating or receiving radiation, the active region being arranged between a first semiconductor layer and a second semiconductor layer on a growth substrate;

forming a plurality of recesses extending through the carrier, the second semiconductor layer and the active region into the first semiconductor layer, wherein forming the recesses comprises:

performing an isotropic etching process in a first substep; and performing an anisotropic etching process in a second substep, wherein the recesses do not completely extend through the carrier after the first substep, wherein the recesses have cross sections on sides of the recesses that face the active region after the second substep, and wherein the cross sections are identical or substantially identical to cross sections of the recesses at a level of the active region;

forming first contacts on a first main surface of the carrier, the first main surface facing away from the semiconductor layer sequence, wherein the first contacts are electrically conductively connected to the first semiconductor layer in regions of the recesses, wherein forming the first contacts comprises forming a first contact layer extending without interruption from the first semiconductor layer to the first main surface of the carrier, and wherein forming the first contact layer comprises applying atomic layer deposition (ALD); and singulating the carrier with the semiconductor layer sequence into the plurality of optoelectronic semiconductor chips, wherein each semiconductor chip has at least one recess.

17. The method according to claim 16, wherein anisotropic etching comprises a deep reactive ion etching process.

18. The method according to claim 16, further comprising forming an insulation layer on surfaces of the plurality of recesses before forming the first contacts.

19. The method according to claim 16, forming the first contacts comprises filling the recesses applying an electroplating method.

20. The method according to claim 16, further comprising thinning the carrier after attaching the semiconductor layer sequence to the carrier and before forming the plurality of recesses.

* * * * *